(12) United States Patent
Ayyapureddi et al.

(10) Patent No.: US 7,804,324 B2
(45) Date of Patent: *Sep. 28, 2010

(54) DYNAMICALLY ADJUSTING OPERATION OF A CIRCUIT WITHIN A SEMICONDUCTOR DEVICE

(75) Inventors: Sujeet Ayyapureddi, Boise, ID (US); Raghukiran Sreeramaneni, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/539,317

(22) Filed: Aug. 11, 2009

(65) Prior Publication Data
US 2009/0295426 A1    Dec. 3, 2009

Related U.S. Application Data

(63) Continuation of application No. 11/856,352, filed on Sep. 17, 2007, now Pat. No. 7,573,288.

(51) Int. Cl.
*H03K 17/16* (2006.01)
(52) U.S. Cl. .......................... 326/30; 326/87
(58) Field of Classification Search .................. 326/26, 326/27, 30, 82–87
See application file for complete search history.

(56) References Cited

U.S. PATENT DOCUMENTS 6,031,385 A * 2/2000 Ilkbahar .................. 324/763

OTHER PUBLICATIONS

Farrell, T., "Core architecture doubles mem date rate"; EE Times Asia; Dec. 16, 2005; EE Times Asia; eMedia Asia Ltd.; New York, NY; http://www.eetasia.com/MUL_technical-articles_32_TA_HTM.
Allan, G., "start: The outlook for DRAMs in consumer electronics"; EDA Tech Forum; Jan. 12, 2007; CMP Media LLP; Manhasset, NY; http://edadesignline.com/196900432;jsessionid=IP1AF51SS4QEEQSNDLPCKHSCJUNN2JVN?printableArticle=true.

* cited by examiner

*Primary Examiner*—Don P Le
(74) *Attorney, Agent, or Firm*—Leffert Jay & Polglaze, P.A.

(57) ABSTRACT

Apparatus including a reference circuit configured to provide a particular impedance and having a first plurality of switching devices and a resistive device coupled to each other in parallel; a second plurality of switching devices coupled to each other in parallel and coupled in series with the reference circuit between a supply node and a supply return node; and processing logic coupled to the second plurality of switching devices and configured to selectively enable and disable a combination of switching devices of the second plurality of switching devices that results in an impedance of the enabled switching devices more closely matching the particular impedance of the reference circuit than at least one other combination of enabled and disabled switching devices of the second plurality of switching devices.

21 Claims, 5 Drawing Sheets

DYNAMICALLY ADJUSTING OPERATION OF A CIRCUIT WITHIN A SEMICONDUCTOR DEVICE

RELATED APPLICATIONS

This application is a continuation of U.S. patent application Ser. No. 11/856,352 (allowed), filed Sep. 17, 2007 now U.S. Pat. No. 7,573,288 and titled "DYNAMICALLY ADJUSTING OPERATION OF A CIRCUIT WITHIN A SEMICONDUCTOR DEVICE," which is commonly assigned and incorporated by reference in its entirety herein.

TECHNICAL FIELD

Digital processing and communication systems have continued to rapidly increase in speed. This increase in speed has brought with it increasingly tighter constraints that are imposed upon integrated circuits (ICs) used in such systems. Whether a given IC meets such constraints is controlled in significant part by how well the IC's processing parameters conform to target values. Threshold voltages, doping concentrations, and resistance values of the various layers that makeup a modern IC, just to name a few examples, can all affect whether an IC conforms to a given set of constraints. These parameters all affect the operational speed of individual devices within an IC.

One way that the speed or performance of the devices within an IC can be described is by way of what is known as "process corners." These corners describe the speed of a device or combination of devices measured at different operating condition extremes. Several operating parameters can be used to define a corner, such as, for example, temperature and voltage. Thus, for example, a resistive device and a capacitive device coupled in series can be used as a reference circuit within an IC, wherein the pre-charge and discharge rates of the circuit are measured under differing temperature and voltage conditions. The measured performance, when compared to the target or expected performance, provides a measure of how close one or more of the processing parameters of the IC are to their target values in the final operational IC.

In the case of complimentary metal-oxide semiconductor (CMOS) ICs, process corners are described in terms of the speed of metal-oxide semiconductor (MOS) devices with positively doped channels (PMOS devices), and MOS devices with negatively doped channels (NMOS devices), as well as in terms of the device structures used to measure the performance of a device. Thus, for example, two resistive devices and capacitive device pairs (the components of each pair coupled in series, one pair including PMOS devices and the other pair including NMOS devices) may be used to characterize a high temperature/low voltage process corner identified as an HL_RC corner. If the PMOS side is faster than the targeted or predicted speed at the given temperature and voltage, and the NMOS side is slower than targeted or predicted, the corner is referred to as an FS corner, meaning Fast/Slow or fast (relative to a target or "typical" speed) for the PMOS side, and slow (again relative to typical) for the NMOS side. The actual measured performance at a process corner can be used to determine if a device is within tolerance and will conform to a particular set of constraints.

As already noted, increases in the operational speed have continued to narrow constraints imposed upon ICs. But as the allowable deviations of the measured performance of devices at the various process corners decreases, the production yield of such ICs also tends to decrease, as it becomes increasingly difficult to control the process parameters to the resolution necessary to conform to target process corners. One solution that has been developed has been to design into ICs the ability to adjust the configuration of operational devices to compensate for variations in process corners that result from variations in processing parameters.

An example of a circuit that compensates for variations in process corners is the ZQ calibration circuit used within double data rate, version 3 (DDR3) synchronous dynamic random access memories (SDRAMs). Such a circuit adjusts the characteristic impedance of an output driver by compensating for changes in process corners associated with both active MOS devices as well as internal resistive devices. However, because resistive devices within both the calibration circuit and the compensated devices tend to be the dominant component, the resulting compensation reflects primarily the influence of process corners associated with the resistive devices. Thus, the resulting compensation may not reflect shifts in the process corners associated with the MOS devices, and in fact may compensate in a manner opposite that needed to compensate for shifts in the process corners associated with the MOS devices.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims, unless otherwise specified. The discussion of any embodiment is meant only to be illustrative of that embodiment, and not intended to intimate that the scope of the disclosure, including the claims, is limited to that embodiment.

Certain terms are used throughout the following discussion and claims to refer to particular system components. This document does not intend to distinguish between components that differ in name but not function. In the following discussion and in the claims, the terms "including" and "comprising" are used in an open-ended fashion, and thus should be interpreted to mean "including but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. Additionally, the term "system" refers to a collection of two or more hardware and/or software components and may be used to refer to an electronic device, such as a memory device, a portion of a memory device, a combination of memory devices, etc. Further, the term "software" includes any executable code capable of running on a processor, regardless of the media used to store the software. Thus, code stored in non-volatile memory, and sometimes referred to as "embedded firmware," is included within the definition of software. Also, the term "driver" includes any circuit used to amplify a signal at any and all stages of processing of said signal, including, but not limited to, pre-drivers and output drivers, and further includes both inverting and non-inverting amplifying circuits.

Because of the tight constraints of modern digital systems, it is no longer sufficient to simply design a device to operate as fast as possible. Instead, signals within a digital circuit must operate within specific tolerances, neither too fast nor too slow. These constraints not only affect output drivers within integrated circuits (ICs) that provide signals to the rest of a digital system, but also affect signals internal to an IC. Pre-driver circuits that provide signals to output drivers, for example, must conform to such constraints in order for the IC to interact with other system components properly. Examples of such constraints may include the target slew rate of a driver, the target gain of a driver, and the target maximum sourcing and sinking currents of a driver. However, it is not always possible to control the processing parameters associated with the production of an integrated circuit with the resolution or level of control necessary to consistently conform to today's tight constraints.

Figure 1:
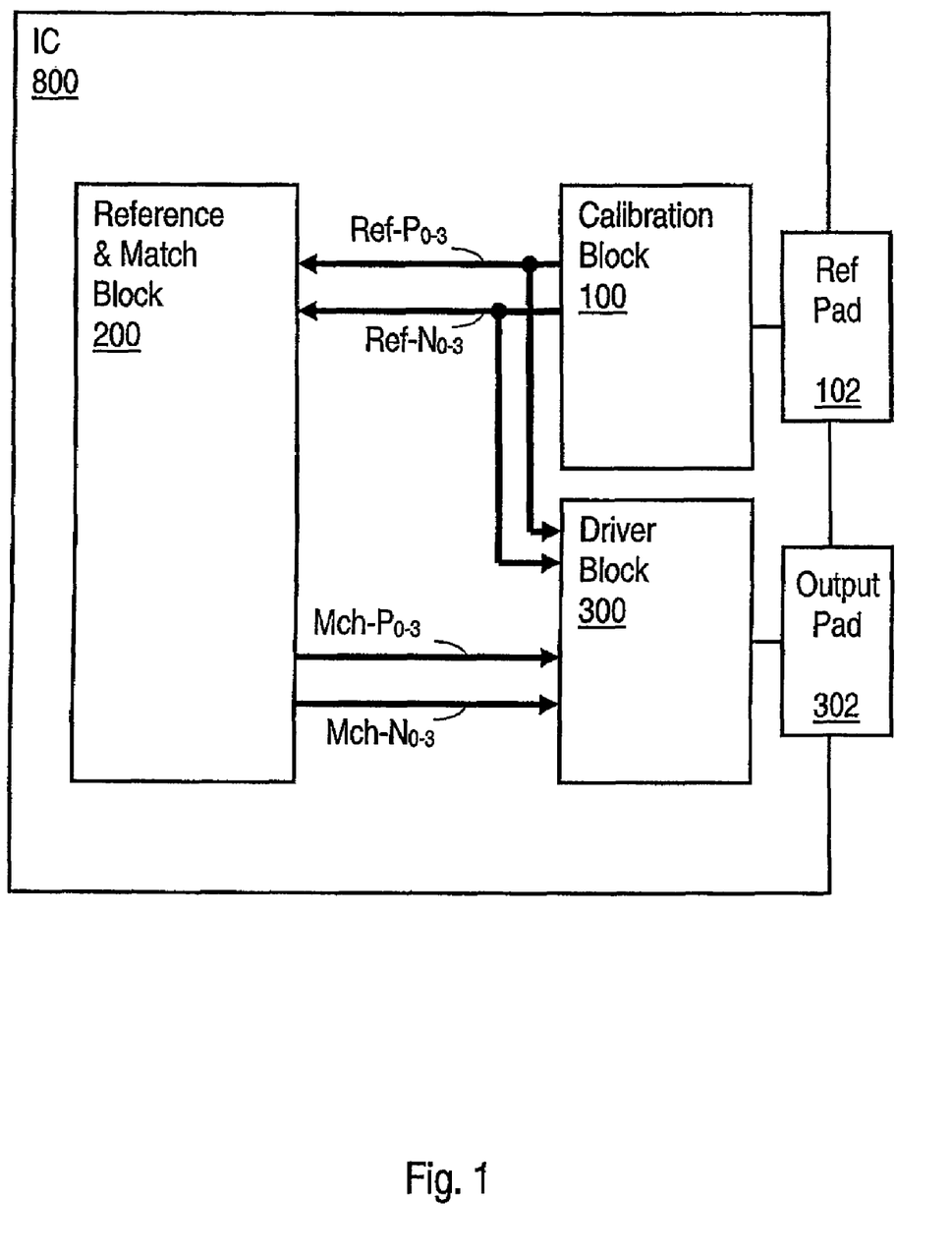
FIG. 1 shows an integrated circuit incorporating calibration, reference and match, and driver blocks, all constructed in accordance with at least some illustrative embodiments.

FIG. 1 shows an integrated circuit (IC) 800 that includes circuitry that identifies process corners associated with the processing parameters and operating characteristics of IC 800, that provides a series of reference impedances that are used to generate control values that are a function of the process corners, and that adjusts the operation of one or more driver stages so as to compensate for variations in the process corners associated with the devices being compensated. IC 800 includes a calibration block 100, a reference and match block 200, and a driver block 300, each coupled to the other. Calibration block 100 provides an initial reference impedance circuit that is calibrated to a precision external reference coupled to reference pad 102. The configuration of the calibrated reference impedance circuit is then duplicated by a similar circuit within reference and match block 200, and used as a basis for configuring a series of matching circuits to match the impedance of the duplicated reference impedance circuit. The matching circuit comprises devices of a particular type (e.g., N-Channel Metal-Oxide Semiconductor or NMOS devices), such that the configuration of the matching circuit that results in an impedance match is indicative of the process corners associated with that type of device. The configuration of the matching circuit of reference and match block 200 is used as a basis for configuring one or more driver stages of driver block 300 (which provides an output signal at output pad 302) so as to compensate for shifts in the process corners of IC 800 that might otherwise cause components within the IC to operate outside of the operating constraints of the system within which IC 800 operates.

Figure 2:
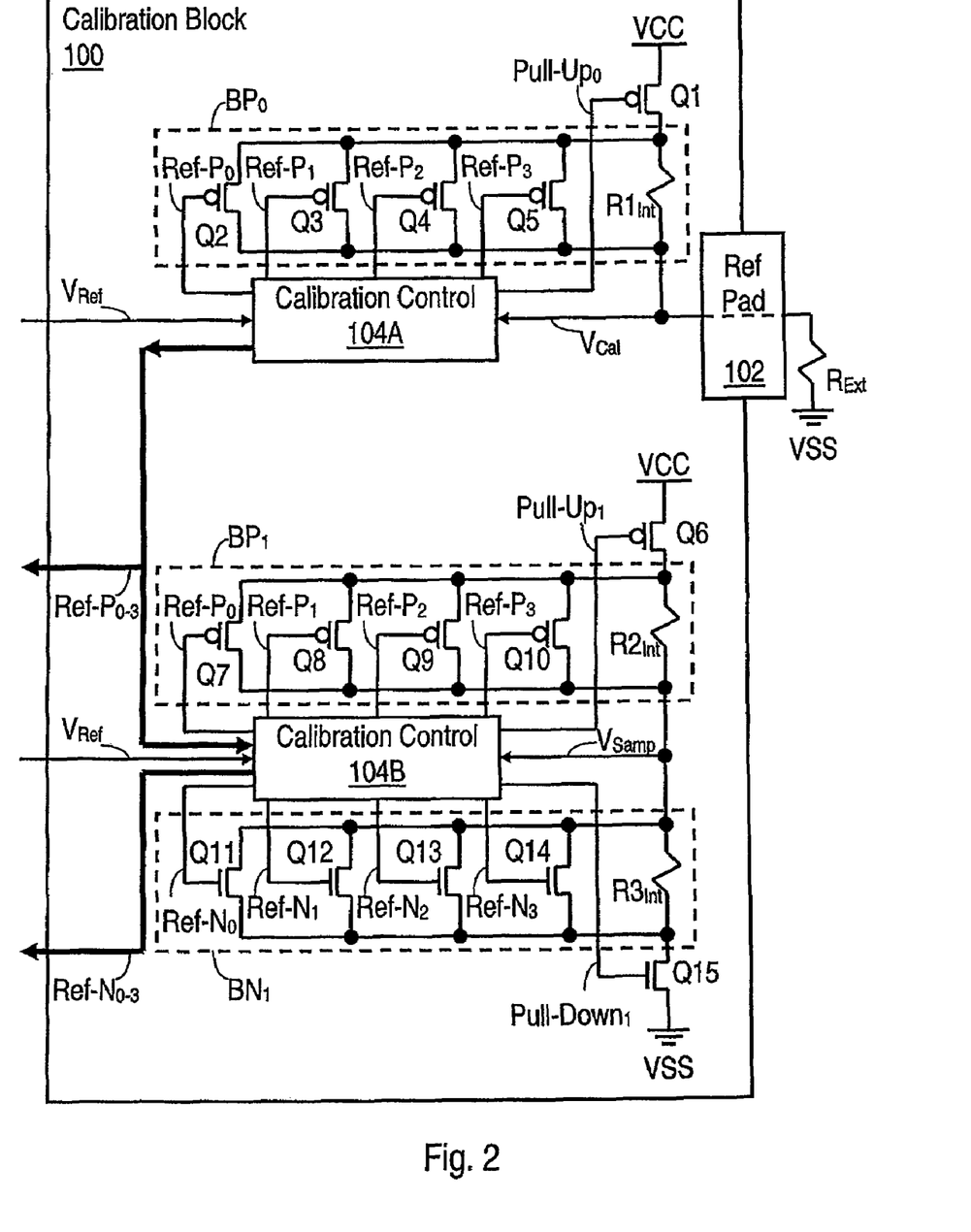
FIG. 2 shows a schematic diagram of the calibration block of FIG. 1, constructed in accordance with at least some illustrative embodiments.

FIG. 2 shows a calibration block 100, constructed in accordance with at least some illustrative embodiments, which couples to external resistor $R_{Ext}$ via Ref pad 102. $R_{Ext}$ is a precision resistor that is used as a reference against which the circuitry of calibration block 100 calibrates itself and the other output drivers of IC 800 of FIG. 1. The calibration circuitry includes PMOS devices Q1 through Q5, resistive device $R1_{Int}$, and calibration control 104A. PMOS devices Q2 through Q5 couple to each other and to resistive device $R1_{Int}$ in parallel, forming pull-up block $BP_0$. The pull-up block matches similar pull-up blocks used as PMOS pull-up drivers in each of the output buffers of IC 800. PMOS device Q1 couples between positive supply VCC and one side of the pull up block, and external resistor $R_{Ext}$ couples between the other side of the pull-up block and supply return VSS.

When a calibration sequence is started, pull-up device Q1 is enabled via the Pull-Up$_0$ signal and devices Q2 through Q5 are disabled. Current flows through device Q1, resistive device $R1_{Int}$ and external resistor $R_{Ext}$. Calibration control 104A, which couples to and controls devices Q1 through Q5, monitors the voltage $V_{Cal}$ present at the node between the resistive device $R1_{Int}$ and resistor $R_{Ext}$, comparing $V_{Cal}$ against reference voltage $V_{Ref}$. Each of devices Q2 through Q5 are sequentially enabled and disabled through all sixteen possible combinations by calibration control logic 104A via pull-up control signals Ref-P$_0$ through Ref-P$_3$. As each device is enabled, the overall impedance is dropped as each enabled device adds a parallel path across resistive device $R1_{Int}$. The combination that results in a $V_{Cal}$ level that is closest to $V_{Ref}$ is the combination that most closely causes the impedance across Q1 and the pull-up block to match the impedance of reference resistor $R_{Ext}$. This is due to the fact that $V_{Ref}$ is configured to equal one half the difference between VCC and VSS. The resulting configuration is then used to calibrate the pull-up stages of the output drivers throughout IC 800 via pull-up control signals Ref-P$_0$ through Ref-P$_3$, which are routed to the output driver pull-up stages of driver block 300, as well as the pull-up reference circuit of reference and match block 200. Other configurations similar to that of FIG. 2 may be used that include additional pull-up blocks in both the calibration circuit and the pull-up stages of the output drivers to accommodate lower impedance values for $R_{Ext}$, and thus lower load impedances.

Once the pull-up stages are configured, a second calibration circuit is used to generate a similar configuration for the pull-down stages of the output drivers of IC 800. The second calibration circuit includes a second PMOS pull-up device Q6 and a second pull-up block $BP_1$, configured to match pull-up block $BP_0$, which includes PMOS devices Q7 through Q10 and internal resistive device $R2_{Int}$, each coupled in parallel to each other and coupled in series with pull-up device Q6, which also couples to VCC. The second calibration circuit includes a pull-down section, coupled to the pull-up section, which includes NMOS devices Q11 through Q14 and internal resistive device $R3_{Int}$, each coupled in parallel to each other and in series with pull-down device Q15, which also couples to VSS.

After the second pull-up block is configured, both pull-up device Q6 and pull-down device Q15 are enabled by calibration control block 104B, which couples to and controls devices Q6 through Q15. Devices Q11 through Q14 are then sequenced in the same manner as devices Q2 through Q5 were sequenced, in order to identify the configuration of enabled NMOS devices within pull-down block $BN_1$ that result in an overall combined impedance of the pull-down block and pull-down device Q15 that most closely matches the combined impedance of Q6 and pull-up block $BP_1$. The resulting configuration of the pull-down block is then used to calibrate the pull-down stages of the output drivers throughout IC 800 via pull-down control signals Ref-N$_0$ through Ref-N$_3$, which are routed to the output driver pull-down stages of driver block 300, as well as the pull-down reference circuit of reference and match block 200. Other configurations similar to that of FIG. 2 may be used that include additional pull-down blocks in both the calibration circuit and the pull-down stages of the output drivers to accommodate lower load impedances.

Figure 3:
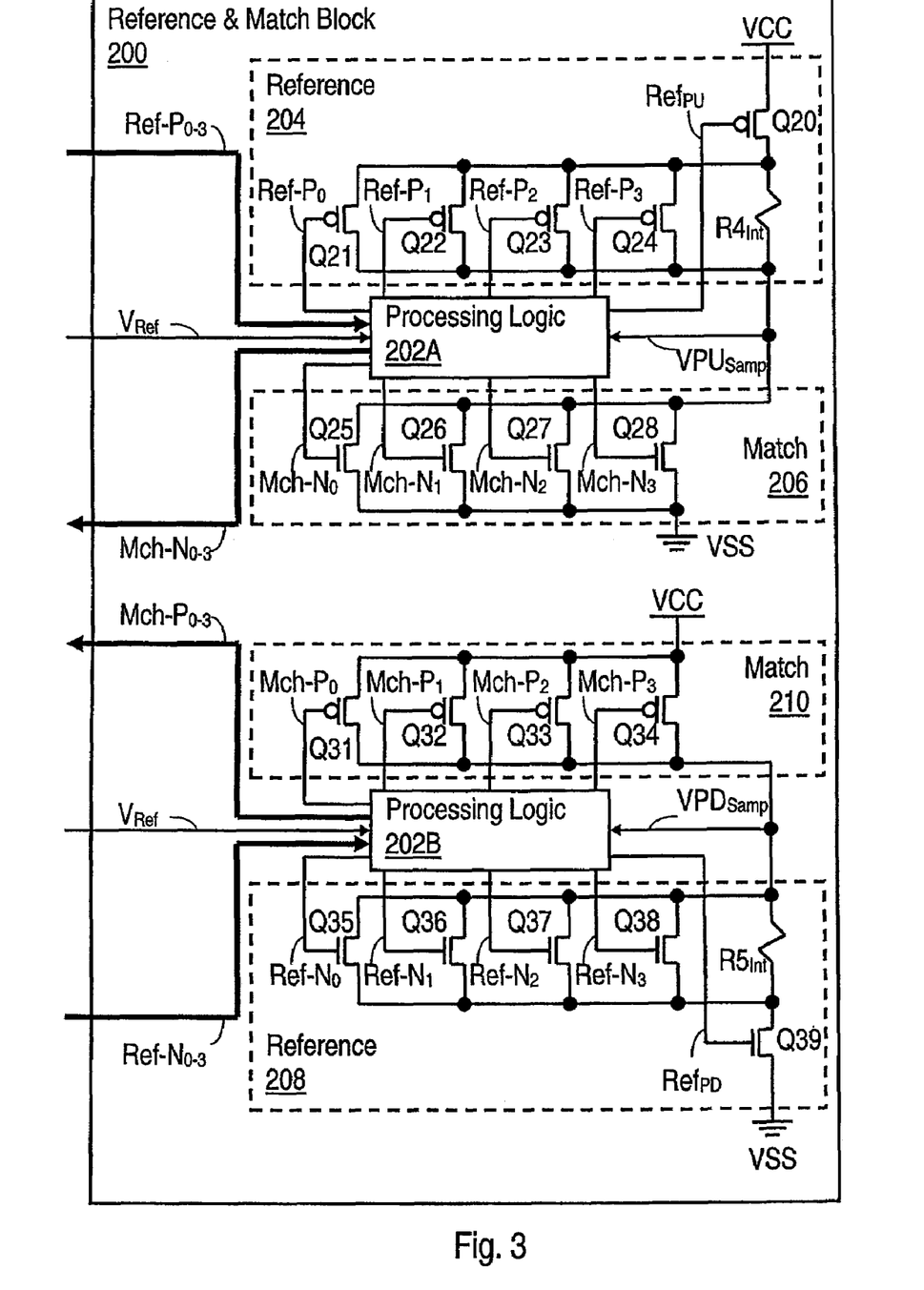
FIG. 3 shows a schematic diagram of the reference and match block of FIG. 1, constructed in accordance with at least some illustrative embodiments.

FIG. 3 shows reference and match block 200, constructed in accordance with at least some illustrative embodiments, which implements an impedance matching process to identify process corners, and to correlate an impedance matching configuration with the process corners associated with a particular type of semiconductor device. A pull-up reference circuit (Reference) 204 is configured to match the pull-up configuration of calibration block 100. Pull-up reference control signals Ref-P$_0$ through Ref-P$_3$ provide the information needed to configure pull-up reference circuit 204 as a "copy" of the pull-up configuration of calibration block 100. Pull-up reference circuit includes PMOS devices Q21 through Q24 and internal resistive device R4$_{Int}$, each coupled in parallel to each other, and PMOS pull-up device Q20, coupled to both VCC and the parallel combination of devices Q21 through Q24 and resistive device R4$_{Int}$. Processing logic 202A couples to and controls devices Q20 through Q24 of pull-up reference circuit 204. By matching the pull-up reference circuit, both in structure and configuration, to an existing reference circuit calibrated to an external precision reference, processing logic 202A configures pull-up reference circuit 204 so as to provide a known reference impedance.

Pull-up reference circuit 204 also couples to pull-down matching circuit 206, and pull-down matching circuit couples to VSS. In the illustrative embodiment of FIG. 3, pull-down matching circuit 206 includes NMOS devices Q25 through Q28, each coupled to and controlled by processing logic 202A, but does not include a resistive device. In at least some illustrative embodiments, processing logic 202A may be implemented in hardware, while in other illustrative embodiments processing logic 202A may be implemented in software (including embedded firmware and/or microcode), as well as combinations of hardware and software. Once pull-up reference circuit 204 is configured to provide a reference impedance, processing logic 202A enables pull-up device Q20 (via the Ref$_{PU}$ control signal), and selectively enables and disables each of devices Q25 through Q28 through all sixteen possible combinations. For each possible combination the difference between reference voltage V$_{Ref}$ (equal to one half the difference between VCC and VSS) and the pull-up sample voltage VPU$_{Samp}$ is monitored. The combination that results in the smallest voltage difference is the combination that results in an impedance of pull-down matching circuit 206 that most closely matches the impedance of pull-up reference circuit 204. The resulting combination is reflected in the binary value represented by pull-down match control signals Mch-N0 through Mch-N3. The pull-down match control signals are then provided to processing control logic 202C of FIG. 4, for use in configuring pre-driver 400 as is described further below.

Likewise, a similar operation is performed by pull-down reference circuit 208 and pull-up matching circuit 210, under the control of processing logic 202B. In the illustrative embodiment of FIG. 3, pull-down reference circuit 208 includes NMOS devices Q35 through Q38 and resistive device R5$_{Int}$, each coupled in parallel to each other. Pull down reference circuit 208 also includes NMOS pull-down device Q39, which couples to both VSS and the parallel combination of NMOS devices Q35 through Q38 and resistive device R5$_{Int}$. Processing logic 202B, which coupled to and controls each of devices Q31 through Q39, configures pull-down reference circuit 208 to match the pull-down configuration of calibration block 100. Pull-down reference control signals Ref-N$_0$ through Ref-N$_3$ provide the information needed to configure pull-down reference circuit 208 as a "copy" of the pull-down configuration of calibration block 100.

Pull-down reference circuit 208 couples to pull-up matching circuit 210, and pull-up matching circuit in turn couples to VCC. In the illustrative embodiment of FIG. 3, pull-up matching circuit 210 includes PMOS devices Q31 through Q34, each coupled to and controlled by processing logic 202B, but does not include a resistive device. In at least some illustrative embodiments, processing logic 202B, like processing logic 202A, may also be implemented in hardware, while in other illustrative embodiments processing logic 202B may be implemented in software (including embedded firmware and/or microcode), as well as combinations of hardware and software. Once pull-down reference circuit 208 is configured to provide a reference impedance, processing logic 202B enables pull-down device Q39 (via the Ref$_{PD}$ control signal) and selectively enables and disables each of devices Q31 through Q34 through all sixteen possible combinations. For each possible combination the difference between reference voltage V$_{Ref}$ and the pull-down sample voltage VPD$_{Samp}$ is monitored. The combination that results in the smallest voltage difference is the combination that results in an impedance of pull-up matching circuit 210 that most closely matches the impedance of pull-down reference circuit 208. The resulting combination is reflected in the binary value represented by pull-up match control signals Mch-P$_0$ through Mch-P$_3$. The pull-down match control signals are then provided to processing control logic 202C of FIG. 4, for use in configuring pre-driver 400, as is also described below.

Figure 4:
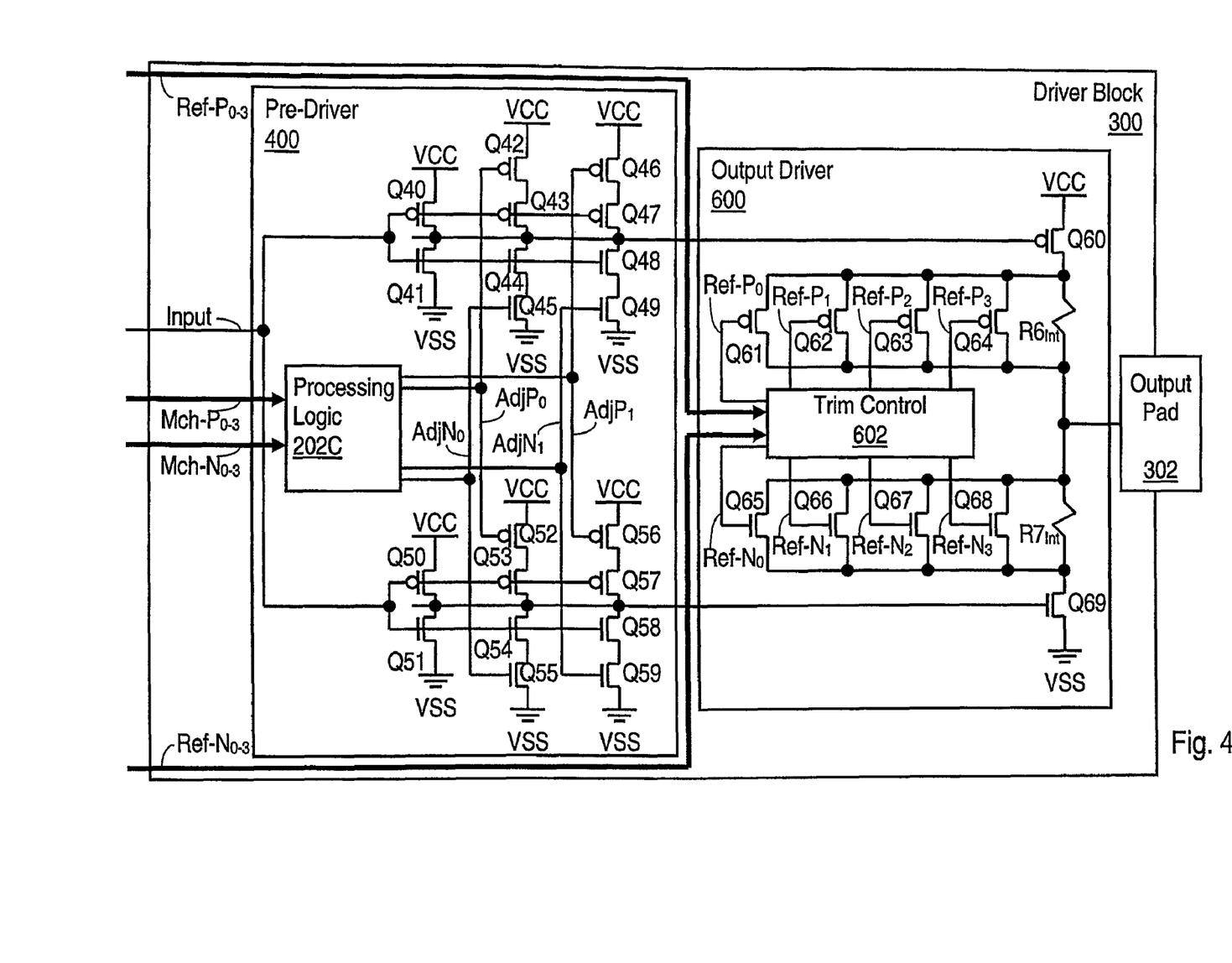
FIG. 4 shows a schematic diagram of the driver block of FIG. 1, constructed in accordance with at least some illustrative embodiments.

FIG. 4 shows driver block 300, constructed in accordance with at least some illustrative embodiments, which utilizes the correlated impedance matching information to compensate a pre-driver circuit based on the identified process corners. Match control signals Mch-P$_{0-3}$ and Mch-N$_{0-3}$ are provided to processing logic 202C of pre-driver 400. As with processing logic 202A and 202B, processing logic 202C may be implemented in hardware, software, or a combination of both hardware and software. Further, in some illustrative embodiments processing logic 202A, 202B and 202C may be separate, distinct hardware and/or software components, while in other illustrative embodiments some or all of processing logic 202A, 202B and 202C may be implemented in a single hardware and/or software component. Many different combinations of implementations for processing logic 202A, 202B and 202C will become apparent to those of ordinary skill in the art, and all such combinations are within the scope of the present disclosure.

In the illustrative embodiment of FIG. 4, pre-driver 400 includes processing logic 202C, which couples to and controls PMOS devices Q42, Q46, Q52 and Q56, as well as NMOS devices Q45, Q49, Q55 and Q59, each of which operate as auxiliary driver branch selection devices, as described below. Pre-driver 400 further includes PMOS primary driver device Q40, which couples to VCC and NMOS primary driver device Q41, which in turn further couples to VSS. The common pre-driver output node in between Q40 and Q41 couples to the gate of PMOS device Q60 of output driver 600. Primary driver devices Q50 and Q51 are similarly configured and couple to the gate of NMOS device Q69 of output driver 600. Output driver 600 includes PMOS devices Q60 through Q64 and resistive device R6$_{Int}$ on the pull-up side of the output driver, and NMOS devices Q65 through Q69 and resistive device R7$_{Int}$ on the pull-down side of the output driver, all coupled to and under the control of trim control 602. Each side of output driver 600 is structured in the same manner as the corresponding pull-up and pull-down blocks of calibration block 100. Each side of output driver 600 is further configured by trim control 602 to match the configuration of the corresponding pull-up and pull-down blocks of calibration block 100, based upon the configuration indicated by control signals Ref-$P_{0-3}$ and Ref-$N_0$, respectively. The final output signal of output driver 600 is made available on output pad 302.

In the illustrative embodiment of FIG. 4, the output node of each primary driver pair of pre-driver 400 couples to two auxiliary driver branches. Each auxiliary driver branch includes a PMOS auxiliary driver device (Q43, Q47, Q53 and Q57) and an NMOS auxiliary driver device (Q44, Q48, Q54 and Q58). Each auxiliary driver device couples to its corresponding pre-driver output node and to an auxiliary branch selection device corresponding to the branch and matching the device type of the auxiliary driver device (PMOS or NMOS). Each PMOS auxiliary branch selection device further couples to VCC, and each NMOS auxiliary branch selection device further couples to VSS. The gates of all of the primary and auxiliary driver devices are coupled together and all respond to a single input signal. While the primary driver devices of the illustrative embodiment of FIG. 4 always drive their respective pre driver output nodes in response to the input signal, each of the auxiliary driver devices will only drive a corresponding pre-driver output node when the selection device associated with a given auxiliary driver devices has enabled that same side (pull-up or pull-down) of the corresponding branch. Thus, for example, Q43 will only drive the pre-driver output node coupled to Q60 when Q42 enables the pull-up side of the auxiliary branch that includes devices Q42 and Q43.

Each of the auxiliary branch selection devices is controlled by processing logic 202C via one of a plurality of adjustment control signals. These are $AdjP_{0-1}$, controlling the pull-up side of the auxiliary branches, and $AdjN_{0-1}$, controlling the pull-down side of the auxiliary branches. The adjustment control signals are configured in response to the binary values of match control signals Mch-$P_{0-3}$ and Mch-$N_{0-3}$, which in turn are responsive to the process corners associated with a particular class of device (e.g., PMOS or NMOS). The interpretation of the binary values of the match control signals depends upon the particular implementation of the matching circuits. In at least one illustrative embodiment, for example, each of the four PMOS devices of matching circuit 210 of FIG. 3 is sized such that the device controlled by Mch-$P_1$ has half the impedance of Mch-$P_0$, the device controlled by Mch-$P_2$ has half the impedance of the device controlled by Mch-$P_1$, and the device controlled by Mch-$P_3$ has half the impedance of the device controlled by Mch-$P_2$. Mch-$P_0$ is the least significant bit and Mch-$P_3$ is the most significant bit of the binary number represented by the control signals, and the resulting binary number thus represents the magnitude of the impedance adjustment made to the matching circuit to minimize the impedance difference between the matching circuit and the reference circuit, relative to other configurations of the matching circuit.

A large adjustment by the above-described matching circuit 210 is indicative of MOS devices with a higher impedance, which is indicative of a slow process corner. Similarly, a moderate value is indicative of a typical process corner, and a small value is indicative of a fast process corner. Each of the process corners identified correlates to processing parameter variations associated with the corresponding type of MOS device (PMOS or NMOS), due to the absence of a resistive device in the matching circuit. In at least some illustrative embodiments, ranges of values are assigned to each type of process corner. Thus, one example of such an assignment would be 0-5 as indicative of a fast process corner, 6-10 as indicative of a typical process corner, and 11-15 as indicative of a slow process corner. Each of these value ranges are mapped by processing logic 202C of FIG. 4 into values for each of the corresponding adjustment control signals, reflecting the process corner identified. Thus for example, if pull-down matching circuit 206 indicates a match value of 14 (slow) and pull-up matching circuit 210 indicates a match value of 7 (typical), processing logic 202C responds by asserting pull-down adjust signals $AdjN_0$ and $AdjN_1$ (enabling both auxiliary pull-down branches of the pre-driver), and by de-asserting adjust signal $AdjP_0$ and asserting adjust signal $AdjP_1$ (enabling only one auxiliary pull-up branch of the pre-driver). Many other configurations of the matching devices, matching signal binary values, and mappings of the matching signal binary values will become apparent to those skilled in the art, and all such configurations are within the scope of the present disclosure.

Figure 5:
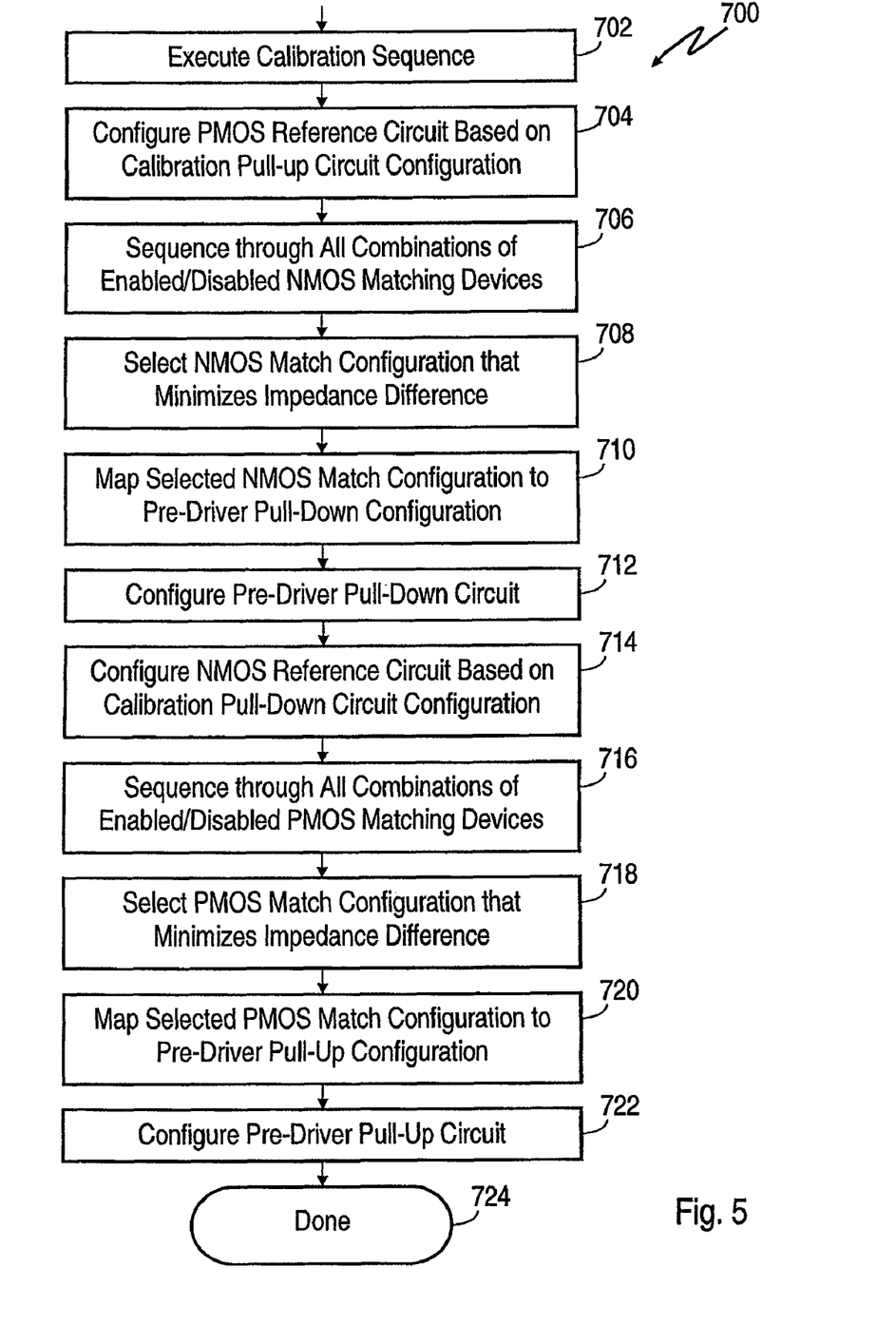
FIG. 5 shows a method for adjusting a driver circuit based upon identified semiconductor process corners, in accordance with at least some illustrative embodiments.

FIG. 5 shows a method 700 for identifying process corners and adjusting a driver circuit based on the identified corners, in accordance with at least some illustrative embodiments. After a calibration sequence has been performed (block 702), the configuration information for the calibration pull-up circuit is used to configure a PMOS reference circuit (block 704), thus providing a PMOS-based reference impedance. An NMOS matching circuit is sequenced through all combinations of enabled and disabled NMOS matching devices (block 706), and the configuration that minimizes the difference between the impedance of the PMOS reference circuit and the impedance of the NMOS matching circuit, relative to other configurations of the NMOS matching devices, is selected (block 708), thus identifying one or more process corners of the NMOS devices. The selected NMOS matching circuit configuration is mapped to a pre-driver pull-down configuration (block 710), based upon the identified process corners, and the pre-driver pull-down circuit is configured accordingly (block 712).

The configuration information for the calibration pull-down circuit is similarly used to configure an NMOS reference circuit (block 714), thus providing an NMOS-based reference impedance. A PMOS matching circuit is sequenced through all combinations of enabled and disabled NMOS matching devices (block 716), and the configuration that minimizes the difference between the impedance of the NMOS reference circuit and the impedance of the PMOS matching circuit, relative to other configurations of the PMOS matching devices, is selected (block 718), thus identifying one or more process corners of the PMOS devices. The selected PMOS matching circuit configuration is mapped to a pre-driver pull-up configuration (block 720), based upon the identified process corners, and the pre-driver pull-up circuit is configured accordingly (block 722), completing the method (block 724).

The systems and methods described herein may be used to determine process corners and adjust circuits, such as pre-driver circuit 400 of FIG. 4, at different times during the operation of a digital system. The detection of process corners and corresponding adjustment of one or more circuits may be performed when the system is initialized, after system initialization, periodically over time, or on demand through the execution of a command directed to the processing logic blocks previously described. In particular, by performing the detection and adjustment dynamically after initialization and during operation of the system, it is possible to re compensate the adjusted circuit to account for shifts in the process corners that may occur over time (e.g., shifts due to increases in the operating temperature of the integrated circuit that includes the adjusted circuit).

The above disclosure is meant to be illustrative of the principles and various embodiments of the present invention. Numerous variations and modifications will become apparent to those skilled in the art once the above disclosure is fully appreciated. For example, although the pre-driver pull-up circuit is configured first in the illustrative embodiments described, the pre-driver pull-up and pull-down circuits may be configured in any order. Further, although a pre-driver circuit is described as the target circuit to be adjusted, those of ordinary skill in the art will recognize that a wide variety of circuits used within integrated circuits and other similar semiconductor devices may be adjusted using the systems and methods described herein, and all such circuits are within the scope of the present disclosure. Also, although the embodiments described are implemented using a complimentary metal-oxide semiconductor (CMOS) process, other MOS processes (e.g., NMOS only and PMOS only), as well as other non-MOS processes (e.g., bipolar) may be used to implement the system and methods described, as well as any combination of process. All such processes and combinations of processes are within the scope of the present disclosure. Additionally, although the present disclosure describes a calibration circuit similar to that used within a memory device, the present disclosure is not intended to be limited to memory devices, but also may include any other device that may be constructed using the semiconductor processes discussed herein. It is intended that the following claims be interpreted to embrace all such variations and modifications.

What is claimed is:

1. An apparatus, comprising:
a reference circuit configured to provide a particular impedance and comprising a first plurality of switching devices and a resistive device coupled to each other in parallel, wherein the first plurality of switching devices have a first doping polarity;
a second plurality of switching devices coupled to each other in parallel, wherein the second plurality of switching devices are coupled in series with the reference circuit between a supply node and a supply return node and wherein the second plurality of switching devices have a second doping polarity opposite the first doping polarity; and
processing logic coupled to the second plurality of switching devices and configured to selectively enable and disable a combination of switching devices of the second plurality of switching devices that results in an impedance of the enabled switching devices more closely matching the particular impedance of the reference circuit than at least one other combination of enabled and disabled switching devices of the second plurality of switching devices.

2. The apparatus of claim 1, wherein the second plurality of switching devices are not coupled in parallel with a resistive device.

3. The apparatus of claim 1, wherein the first and second plurality of switching devices each comprises field effect transistors, wherein the first plurality of switching devices have positively-doped channels and wherein the second plurality of switching devices have negatively-doped channels.

4. The apparatus of claim 3, wherein the reference circuit is coupled in series between the supply node and the second plurality of switching devices and wherein the second plurality of switching devices is coupled in series between the reference circuit and the supply return node.

5. The apparatus of claim 1, wherein the first and second plurality of switching devices each comprises field effect transistors, wherein the first plurality of switching devices have negatively-doped channels and wherein the second plurality of switching devices have positively-doped channels.

6. The apparatus of claim 5, wherein the reference circuit is coupled in series between the supply return node and the second plurality of switching devices and wherein the second plurality of switching devices is coupled in series between the reference circuit and the supply node.

7. The apparatus of claim 1, wherein the combination of enabled and disabled switching devices of the second plurality of switching devices is represented by a binary number that represents a magnitude of an impedance adjustment made to the second plurality of switching devices.

8. The apparatus of claim 1,
wherein the processing logic is configured to determine a voltage difference between a reference voltage and a voltage at a node coupled between the reference circuit and the second plurality of switching devices; and
wherein the processing logic is configured to selectively enable and disable the combination of switching devices of the second plurality of switching devices that results in the smallest voltage difference relative to at least one other combination of enabled and disabled switching devices of the second plurality of switching devices.

9. The apparatus of claim 8, wherein the reference voltage is configured to equal one-half the difference between a voltage of the supply node and a voltage of the supply return node.

10. The apparatus of claim 1, wherein the processing logic is further configured to selectively enable and disable switching devices of the first plurality of switching devices to match a configuration of a calibration circuit.

11. An apparatus, comprising:
a first reference circuit configured to provide a particular impedance and comprising a first plurality of switching devices and a first resistive device coupled to each other in parallel, wherein the first plurality of switching devices have a first doping polarity;
a second reference circuit configured to provide the particular impedance and comprising a second plurality of switching devices and a second resistive device coupled to each other in parallel, wherein the second plurality of switching devices have a second doping polarity opposite the first doping polarity;
a third plurality of switching devices coupled to each other in parallel, wherein the third plurality of switching devices are coupled in series with the first reference circuit between a supply node and a supply return node and wherein the third plurality of switching devices have the second doping polarity;
a fourth plurality of switching devices coupled to each other in parallel, wherein the fourth plurality of switching devices are coupled in series with the second reference circuit between the supply node and the supply return node and wherein the fourth plurality of switching devices have the first doping polarity;
first processing logic coupled to the third plurality of switching devices and configured to selectively enable and disable a combination of switching devices of the third plurality of switching devices that results in an impedance of the enabled switching devices more closely matching the particular impedance than at least one other combination of enabled and disabled switching devices of the third plurality of switching devices; and
second processing logic coupled to the fourth plurality of switching devices and configured to selectively enable and disable a combination of switching devices of the fourth plurality of switching devices that results in an impedance of the enabled switching devices more closely matching the particular impedance than at least one other combination of enabled and disabled switching devices of the fourth plurality of switching devices.

12. An integrated circuit for driving an output signal, comprising:
a first reference circuit configured to provide a particular impedance and comprising a first plurality of switching devices and a resistive device coupled to each other in parallel, wherein the first plurality of switching devices have a first doping polarity;
a second plurality of switching devices coupled to each other in parallel, wherein the second plurality of switching devices are coupled in series with the first reference circuit between a supply node and a supply return node, and wherein the second plurality of switching devices have a second doping polarity opposite the first doping polarity; and
a first processing logic coupled to the second plurality of switching devices and configured to selectively enable and disable a combination of switching devices of the second plurality of switching devices that results in an impedance of the enabled switching devices more closely matching the particular impedance than at least one other combination of enabled and disabled switching devices of the second plurality of switching devices, wherein the first processing logic is further configured to generate a first plurality of match control signals representative of the selected combination of enabled and disabled switching devices of the second plurality of switching devices; and
a first driver circuit, comprising:
a first plurality of primary driver devices; and
a first plurality of auxiliary driver branches coupled in parallel to the first plurality of primary driver devices, each of the first plurality of auxiliary driver branches comprising a first plurality of auxiliary driver devices that are responsive to a same input signal as the first plurality of primary driver devices; and
a second processing logic coupled to the first plurality of auxiliary driver branches and configured to selectively enable and disable a combination of the auxiliary driver branches of the first plurality of auxiliary driver branches in response to the first plurality of match control signals to drive a common first output signal in parallel with the first plurality of primary driver devices.

13. The integrated circuit of claim 12, further comprising:
a second reference circuit configured to provide the particular impedance and comprising a third plurality of switching devices and a second resistive device coupled to each other in parallel, wherein the third plurality of switching devices have the second doping polarity;
a fourth plurality of switching devices coupled to each other in parallel, wherein the fourth plurality of switching devices are coupled in series with the second reference circuit between the supply node and the supply return node and wherein the fourth plurality of switching devices have the first doping polarity;
a third processing logic coupled to the fourth plurality of switching devices and configured to selectively enable and disable a combination of switching devices of the fourth plurality of switching devices that results in an impedance of the enabled switching devices more closely matching the particular impedance than at least one other combination of enabled and disabled switching devices of the fourth plurality of switching devices, wherein the third processing logic is further configured to generate a second plurality of match control signals representative of the selected combination of enabled and disabled switching devices of the fourth plurality of switching devices; and
a second driver circuit, comprising:
a second plurality of primary driver devices; and
a second plurality of auxiliary driver branches coupled in parallel to the second plurality of primary driver devices, each of the second plurality of auxiliary driver branches comprising a second plurality of auxiliary driver devices that are responsive to a same input signal as the second plurality of primary driver devices; and
fourth processing logic coupled to the second plurality of auxiliary driver branches and configured to selectively enable and disable a combination of the auxiliary driver branches of the second plurality of auxiliary driver branches in response to the second plurality of match control signals to drive a common second output signal in parallel with the second plurality of primary driver devices.

14. The apparatus of claim 12, wherein each of the first plurality of auxiliary driver branches further comprises a selection device coupled in series with the first plurality of auxiliary driver devices, and wherein the processing logic enables a particular auxiliary driver branch by enabling the selection device within that particular auxiliary driver branch.

15. The apparatus of claim 12, wherein the plurality of match signals is representative of a numeric value representative of a magnitude of an impedance adjustment made to the plurality of second switching devices and wherein the second processing logic is further configured to selectively enable and disable the combination of auxiliary driver branches of the first plurality of auxiliary driver branches in response to ranges of the numeric value.

16. The apparatus of claim 12, wherein the ranges of the numeric value are selected to adjust the apparatus to conform to a target performance parameter selected from a group consisting of a target slew rate range, a target gain range, a target maximum sourcing current range, and a target maximum sinking current range.

17. The apparatus of claim 12, wherein the second plurality of switching devices are not coupled in parallel with a resistive device.

18. The apparatus of claim 12, wherein the first and second plurality of switching devices each comprises field effect transistors, wherein the first plurality of switching devices have positively-doped channels and wherein the second plurality of switching devices have negatively-doped channels.

19. The apparatus of claim 18, wherein the first reference circuit is coupled in series between the supply node and the second plurality of switching devices and wherein the second plurality of switching devices is coupled in series between the reference circuit and the supply return node.

20. The apparatus of claim 13, further comprising:
an output driver configured to provide a final output signal to an output node in response to the common first output signal and the common second output signal.

21. The apparatus of claim 20, wherein the output driver comprises:
a first primary driver device having the first doping polarity and coupled to a supply node;
a second primary driver device having the second doping polarity and coupled to a supply return node;
a fifth plurality of switching devices and a third resistive device coupled to each other in parallel, wherein the fifth plurality of switching devices have the first doping polarity, wherein the fifth plurality of switching devices and the third resistive device are configured to provide the particular impedance and wherein the fifth plurality of switching devices are coupled between the first primary driver device and the output node; and a sixth plurality of switching devices and a fourth resistive device coupled to each other in parallel, wherein the sixth plurality of switching devices have the second doping polarity, wherein the sixth plurality of switching devices and the fourth resistive device are configured to provide the particular impedance and wherein the sixth plurality of switching devices are coupled between the second primary driver device and the output node.

* * * * *